(12) United States Patent
Kim

(10) Patent No.: US 11,249,329 B2
(45) Date of Patent: Feb. 15, 2022

(54) DISPLAY DEVICE, METHOD OF FABRICATING THE SAME, AND POLARIZING FILM FOR DISPLAY DEVICE

(71) Applicant: SAMSUNG DISPLAY CO., LTD., Yongin-si (KR)

(72) Inventor: Nam Jin Kim, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 350 days.

(21) Appl. No.: 16/159,391

(22) Filed: Oct. 12, 2018

(65) Prior Publication Data

US 2019/0162985 A1    May 30, 2019

(30) Foreign Application Priority Data

Nov. 28, 2017 (KR) .................. 10-2017-0160009

(51) Int. Cl.

| G02F 1/01 | (2006.01) |
|---|---|
| H01L 51/52 | (2006.01) |
| G02B 27/28 | (2006.01) |
| H01L 27/32 | (2006.01) |
| H01L 51/56 | (2006.01) |

(52) U.S. Cl.
CPC ........... G02F 1/0136 (2013.01); G02B 27/28 (2013.01); H01L 27/3232 (2013.01); H01L 27/3244 (2013.01); H01L 51/5253 (2013.01); H01L 51/5262 (2013.01); H01L 51/56 (2013.01)

(58) Field of Classification Search
None
See application file for complete search history.

(56) References Cited

U.S. PATENT DOCUMENTS

| 2006/0141243 | A1* | 6/2006 | Ibuki .................. G02B 1/111 428/334 |
|---|---|---|---|
| 2009/0109134 | A1* | 4/2009 | Kim ................ G02F 1/136204 345/55 |
| 2013/0242365 | A1* | 9/2013 | Koyanagi .............. G02B 27/48 359/207.9 |
| 2013/0314612 | A1* | 11/2013 | Kuroda ............. G02F 1/133308 348/739 |
| 2015/0079354 | A1* | 3/2015 | Sakamoto ................ B05D 3/12 428/172 |
| 2015/0228209 | A1* | 8/2015 | Yoo ...................... G02B 17/006 359/839 |
| 2017/0123124 | A1 | 5/2017 | Hatanaka et al. |
| 2017/0229674 | A1* | 8/2017 | Jin ...................... H01L 51/0097 |
| 2017/0294621 | A1* | 10/2017 | Higano ............... G02F 1/13452 |
| 2018/0149871 | A1* | 5/2018 | Chuang ............. G02B 27/0172 |

FOREIGN PATENT DOCUMENTS

KR    10-2015-0062237    6/2015

* cited by examiner

*Primary Examiner* — Christopher Stanford
*Assistant Examiner* — Journey F Sumlar
(74) *Attorney, Agent, or Firm* — F. Chau & Associates, LLC

(57) ABSTRACT

Provided are a display device, a method of fabricating the same, and a polarizing film for a display device. The display device comprises a display panel, and an optical film attached to the display panel, wherein the optical film comprises a plurality of edges, and a side surface of at least one edge of the plurality of edges of the optical film is an acutely inclined surface that has an acute inclination angle with respect to a lower surface of the optical film and an asymmetric shape in a thickness direction of the optical film.

19 Claims, 20 Drawing Sheets

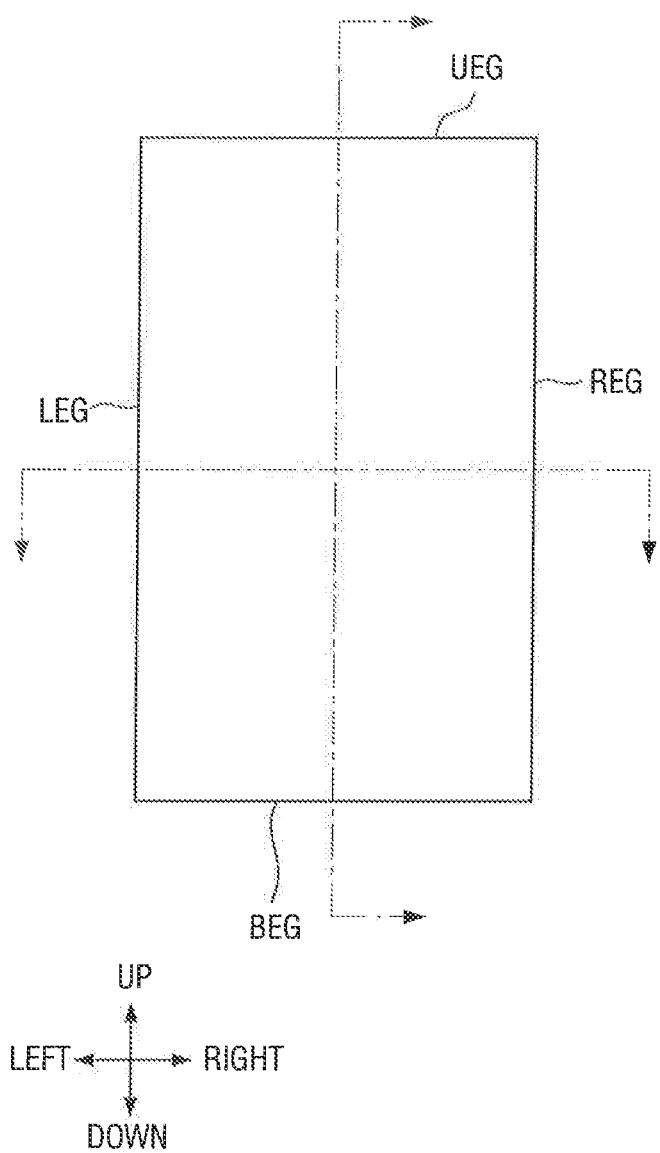

200_6

BEG　　　　　　　　　　UEG　　LEG　　　　　　　　　REG
(DOWN)　　　　　　　　　(UP)　(LEFT)　　　　　　　　(RIGHT)

DISPLAY DEVICE, METHOD OF FABRICATING THE SAME, AND POLARIZING FILM FOR DISPLAY DEVICE

This application claims priority under 35 USC § 119 from, and the benefit of, Korean Patent Application No. 10-2017-0160009, filed on Nov. 28, 2017 in the Korean Intellectual Property Office, the contents of which are herein incorporated by reference in their entirety.

BACKGROUND

1. Technical Field

Embodiments of the present disclosure are directed to a display device, a method of fabricating the same, and a polarizing film for a display device.

2. Discussion of the Related Art

Display devices are becoming increasingly important as multimedia develops. Accordingly, various types of display devices such as organic light emitting diode (OLED) display devices or liquid crystal display (LCD) devices are being used.

A display device may include an optical film. The optical film is attached to a display panel of the display device to modify or improve optical characteristics thereof. The optical film may include a polarizing film. For example, a polarizing film may be attached to a display surface of an OLED display device to reduce reflection of external light, or may be attached to a display panel of an LCD device to control transmittance. In addition, the optical film may include a phase difference film, a prism film, a micro-lens film, a lenticular film, a protective film, etc., and may be attached to the display device according to various applications.

SUMMARY

As a size of a bezel of a display device is reduced, an end of a polarizing film may be disposed on a circuit element. When the end is subjected to large pressure stresses during attachment of the polarizing film, the circuit element can be damaged.

Embodiments of the present disclosure can provide a display device in which a circuit element under an edge of an optical film to be attached thereto is prevented from being damaged.

Embodiments of the present disclosure can provide a method of fabricating a display device in which pressure stresses on an edge of an optical film are relieved when the optical film is attached.

Embodiments of the present disclosure can provide a polarizing film that can relieve pressure stress at an edge thereof when the polarizing film is applied to a display device as described above.

In accordance with an embodiment of the present disclosure, a display device includes a display panel, and an optical film attached to the display panel, wherein the optical film comprises a plurality of edges, and a side surface of at least one edge of the plurality of edges of the optical film is an acutely inclined surface that has an acute inclination angle with respect to a lower surface of the optical film and an asymmetric shape in a thickness direction of the optical film.

The at least one side edge of the optical film may be positioned inward from a side edge of the display panel.

The display panel may include a passivation layer, and the at least one edge may be aligned with one side edge of the passivation layer.

The display panel may include a flat portion and a bent portion disposed at one side of the flat portion, and the at least one edge of the optical film may be disposed on the flat portion.

The display device may further include a bent protection layer that covers the bent portion and in contact with the acutely inclined surface.

A side surface of the bent protection layer in contact with the acutely inclined surface may have an obtuse inclination angle with respect to a bottom surface of the bent protection layer.

The display panel may include an electrostatic dissipation region in which an electrostatic diode is disposed, and the at least one edge of the optical film may be disposed on the electrostatic dissipation region.

The acutely inclined surface of the optical film may be flat.

The acutely inclined surface of the optical film may include a first section having a first inclination angle, and a second section disposed above the first section and having a second inclination angle that is less than the first inclination angle.

The acutely inclined surface of the optical film may have an outwardly curved convex shape.

The display panel may include an organic light emitting display panel, and the optical film may include a polarizing film.

The display device may further include an adhesive layer disposed between the optical film and the display panel, and side surfaces of all edges of the adhesive layer may have a right inclination angle with respect to a bottom surface of the adhesive layer.

In accordance with another embodiment of the present disclosure, a method of fabricating a display device includes providing a display panel, disposing an optical film on the display panel, wherein a side surface of one side edge of the optical film has an acute inclination angle with respect to a bottom surface of the optical film and an asymmetrical shape in a thickness direction of the optical film, and pressing the optical film in a direction from the one side edge to an opposite side edge.

Pressing the optical film may include moving a pressure roller.

The display panel may include a flat portion and a bent portion, and the optical film may be disposed on the flat portion. The method of fabricating the display device may further include forming a bent protection layer that covers the bent portion and is in contact with the side surface of one side edge of the optical film The optical film may include a polarizing film and the release film disposed on an upper surface of the polarizing film. The method of fabricating the display device may further include removing the release film after forming the bent protection layer.

In accordance with still another embodiment of the present disclosure, a polarizing film includes a plurality of edges, wherein a side surface of at least one edge of the plurality of edges is an acutely inclined surface that has an acute inclination angle with respect to a bottom surface of the polarizing film and an asymmetric shape in a thickness direction of the polarizing film.

The acutely inclined surface may be flat.

The acutely inclined surface may include a first section having a first inclination angle, and a second section disposed above the first section and having a second inclination angle that is less than the first inclination angle.

The acutely inclined surface may have an outwardly curved convex shape.

Details of other embodiments are included in the detailed description and drawings.

BRIEF DESCRIPTION OF THE DRAWINGS

FIG. 11 is a plan view of a polarizing film according to an exemplary embodiment.

DETAILED DESCRIPTION OF EXEMPLARY EMBODIMENTS

Figure 1:
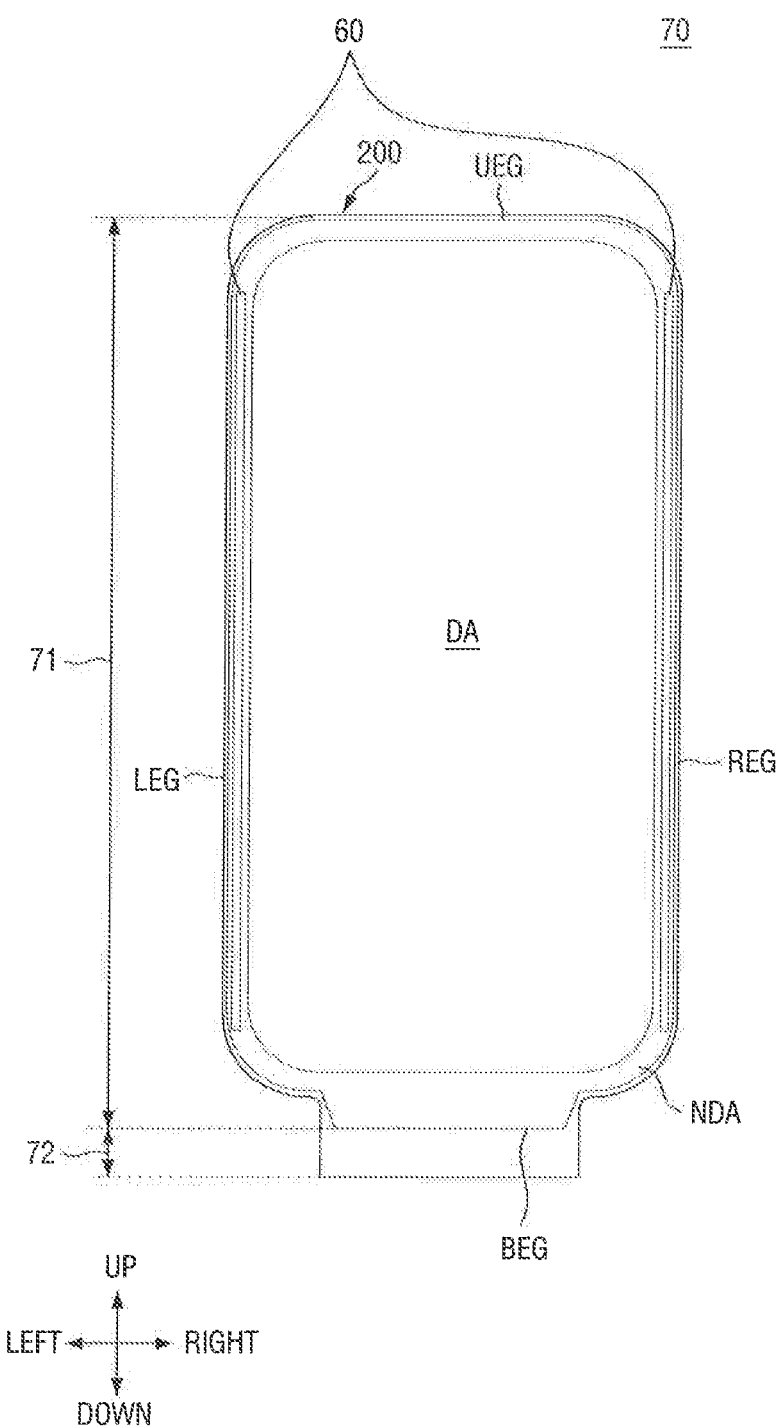
FIG. 1 is a plan view of an organic light emitting diode (OLED) display device according to an exemplary embodiment.

Features of embodiment of the present disclosure and methods of accomplishing the same may be understood more readily by reference to the following detailed description of exemplary embodiments and the accompanying drawings. Embodiments of the present disclosure may have many different forms and should not be construed as being limited to the exemplary embodiments set forth herein.

The same reference numerals may refer to the same constituent elements throughout the specification.

A display device can display a moving image or a still image. A display device can be a display screen of mobile electronic devices such as a mobile phone, a smart phone, a tablet personal computer (PC), a smart watch, a watch phone, a mobile communication terminal, an electronic notebook, an electronic book, a portable multimedia player (PMP), a navigation, or an ultra-mobile PC (UMPC) as well as a display screen of various other products such as a television, a notebook computer, a monitor, a billboard, or an Internet of Things (IoT). For example, a display device can be an OLED display device, an LCD device, a plasma display panel (PDP) display device, a field emission display (FED) device, an electrophoretic display (EPD) device, etc.

A display device may include an optical film. The optical film can be attached to a display panel of the display device to modify or improve optical characteristics thereof. The optical film may include a polarizing film. For example, a polarizing film may be attached to a display surface of an OLED display device to reduce reflection of external light, or may be attached to a display panel of an LCD device to control transmittance. In addition, the optical film may include a phase difference film, a prism film, a micro-lens film, a lenticular film, a protective film, etc., and may be attached to the display device according to various applications.

Hereinafter, a polarizing film will be described as an example of an optical film, and an OLED display device will be described as an example of a display device, but embodiments are not limited thereto.

Figure 2:
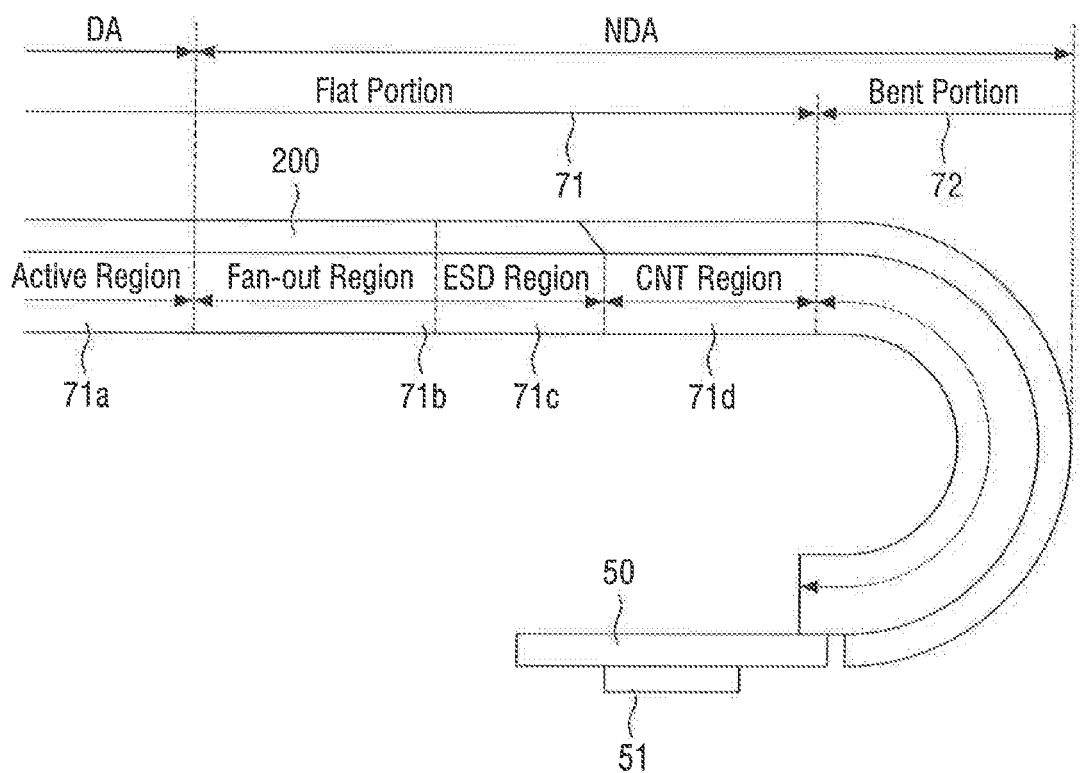
FIG. 2 is a schematic partial sectional view of an OLED display device according to an exemplary embodiment.

FIG. 1 is a plan view of an organic light emitting diode (OLED) display device according to an exemplary embodiment. FIG. 2 is a schematic partial sectional view of an OLED display device according to an exemplary embodiment. In the plan view of FIG. 1, the up, down, left, and right directions are defined for the purpose of convenience of description. The up and down directions are a longitudinal direction or a column direction, and the left and right directions are a lateral direction or a row direction.

According to an embodiment, referring to FIGS. 1 and 2, an OLED display device 70 includes a display area DA and a non-display area NDA disposed at a periphery of the display area DA.

According to an embodiment, the display area DA is for displaying a screen. A planar shape of the display area DA may be a rectangular shape or a rectangular shape with rounded corners. However, embodiments are not limited thereto, and the planar shape of the display area DA may be a circular shape, an elliptical shape, or various other shapes. The display area DA includes an active region 71a that includes a plurality of pixels. A sectional structure of the pixel will be described below with reference to FIG. 3.

According to an embodiment, the non-display area NDA is disposed at a periphery of the display area DA. The non-display area NDA constitutes a border of the OLED display device 70.

According to an embodiment, a driver that drives a pixel circuit of the display area DA is disposed in the non-display area NDA. The driver includes a driving circuit and a driving wire that transmits a driving signal.

According to an embodiment, the OLED display device 70 includes a polarizing film 200 disposed on a display surface thereof. The polarizing film 200 is attached to the display surface of the OLED display device 70 through an adhesive layer 210, shown in FIG. 3. The polarizing film 200 includes four edges, respectively referred to as a lower edge BEG, an upper edge UEG, a left edge LEG, and a right edge REG. The lower edge BEG and the upper edge UEG of the polarizing film 200 face each other, and the left edge LEG and the right edge REG face each other.

According to an embodiment, the polarizing film 200 covers an entire display area DA. Further, the polarizing film 200 extends outward from an outer edge of the display area DA to cover at least a part of the non-display area NDA. For example, the upper edge UEG, the left edge LEG, and the right edge REG of the polarizing film 200 are aligned with an upper edge, a left edge, and a right edge of the non-display area NDA, respectively, whereas the lower edge BEG of the polarizing film 200 is positioned inward from a lower edge of the non-display area NDA at a position between the lower edge of the display area DA and the lower edge of the non-display area NDA to expose a part of the non-display area NDA at the lower edge BEG. However, embodiments are not limited thereto, and a part of the non-display area NDA can be exposed at other edges. At least one side surface of the polarizing film 200 has an acute inclination angle with respect to the bottom surface thereof and an asymmetric shape in a thickness direction thereof. A detailed description thereof will be given below.

In an exemplary embodiment, the OLED display device 70 includes a flat portion 71 and a bent portion 72. The bent portion 72 is bent in a direction opposite from a display direction, which is a rearward direction in the case of a front emission type device, based on the flat portion 71. The bent portion 72 is disposed on at least one side of the flat portion 71. Although a case in which one bent portion 72 is disposed adjacent to a lower edge of the flat portion 71 is illustrated in the drawing, the bent portion 72 can be disposed on at least two edges of the flat portion 71, for example, the bending portion 72 can be disposed on the lower edge and an upper edge of the flat portion 71. In addition, the bent portion 72 is adjacent to other edges of the flat portion 71, such as a left edge, a right edge, and the upper edge in addition to the lower edge of the flat portion 71.

According to an embodiment, the display area DA and a part of the non-display area NDA are disposed in the flat portion 71. The remaining part of the non-display area NDA is disposed in the bent portion 72. As described above, when at least a part of the non-display area NDA is bent in the direction opposite the display direction, a bezel of the OLED display device 70 can be reduced.

First, according to an embodiment, the non-display area NDA disposed in the flat portion 71 will be described. A scan driver 60 is disposed in the non-display area NDA adjacent to the left edge or the right edge of the display area DA. The scan driver 60 includes a scan driving circuit and a scan signal wire that transmits a scan signal output therefrom.

According to an embodiment, a driving signal wire that transmits a driving signal from a driving chip 51 is disposed in the non-display area NDA adjacent to the lower edge of the display area DA. The driving chip 51 is directly mounted on the non-display area NDA of the flat portion 71 or the bent portion 72 to be connected to the driving signal wire, or a printed circuit board 50 on which the driving chip 51 is mounted is attached to the non-display area NDA of the bent portion 72 so that the driving chip 51 and the driving signal wire of the non-display area NDA can be electrically connected to each other.

According to an embodiment, a portion of the non-display area NDA of the flat portion 71 adjacent to the lower edge of the display area DA includes a fan-out region 71b, an electrostatic dissipation (ESD) region 71c, and a wire contact (CNT) region 71d, which are sequentially arranged in an outward direction. The bent portion 72 is disposed adjacent to an outer side of the wire contact region 71d.

According to an embodiment, a data line of the display area DA, a wire that transmits a signal to a power source voltage line, and a wire that transmits a signal to the scan driver are disposed in the fan-out region 71b.

According to an embodiment, the electrostatic dissipation ESD region 71c includes an electrostatic dissipation circuit. The electrostatic dissipation circuit can eliminate static electricity that is generated during a fabricating process or a driving operation, and can prevent the pixel circuit of the active region 71a or the scan driving circuit of the scan driver 60 from being damaged. The electrostatic dissipation circuit includes at least one electrostatic diode. The electrostatic diode includes at least one thin film transistor.

In one exemplary embodiment, a lateral width of the bent portion 72 is less than a lateral width of the flat portion 71 that crosses the display area DA. Further, similar to the bent portion 72, lateral widths of the wire contact CNT region 71d, the electrostatic dissipation ESD region 71c, and the fan-out region 71b of the flat portion 71 adjacent to the bent portion 72 are less than the lateral width of the flat portion 71 that crosses the display area DA.

According to an embodiment, the polarizing film 200 covers the display area DA of the flat portion 71, the fan-out region 71b of the non-display area NDA, and at least a part of the electrostatic dissipation region 71c. The polarizing film 200 exposes the bent portion 72 and at least a part of the wire contact CNT region 71d of the flat portion 71. The lower edge BEG of the polarizing film 200 is disposed between the electrostatic dissipation region 71c and the wire contact region 71d. Although FIG. 1 illustrates a case in which the lower edge BEG of the polarizing film 200 is disposed at a boundary between the electrostatic dissipation region 71c and the wire contact region 71d, the lower edge BEG of the polarizing film 200 may be disposed on the electrostatic dissipation region 71c or the wire contact region 71d.

Hereinafter, a sectional structure of an OLED display device according to an embodiment will be described in more detail.

Figure 3:
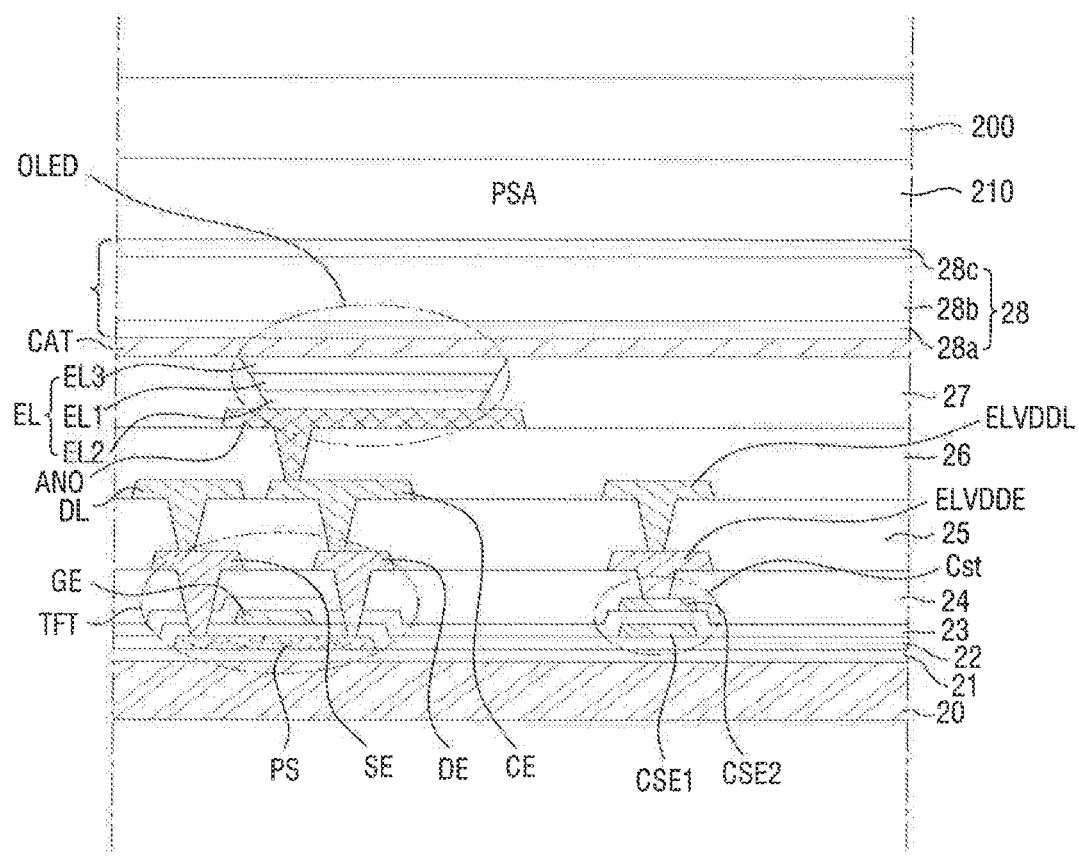
FIG. 3 is a sectional view of a pixel of an OLED display device according to an exemplary embodiment.

FIG. 3 is a sectional view of a pixel of an OLED display device according to an exemplary embodiment.

According to an embodiment, referring to FIG. 3, a pixel of the OLED display device 70 includes at least one thin film transistor TFT, a storage capacitor Cst, and an OLED OLED, which are disposed on a substrate 20. The thin film transistor TFT includes a semiconductor layer PS, a gate electrode GE, a source electrode SE, and a drain electrode DE. The storage capacitor Cst includes a first electrode CSE1 and a second electrode CSE2. The OLED OLED includes an anode electrode ANO, a cathode electrode CAT, and an organic layer EL disposed therebetween.

According to an embodiment, the substrate 20 supports various layers disposed thereon. The substrate 20 is formed of an insulating material. The substrate 20 may be formed of an inorganic material such as glass or quartz, or may be formed of an organic material such as polyimide. The substrate 20 may be a rigid substrate or a flexible substrate.

According to an embodiment, a buffer layer 21 is disposed on the substrate 20. The buffer layer 21 can prevent impurity ions from diffusing into the substrate 20, moisture or ambient air from penetrating into the substrate 20, and can perform a surface planarization function. The buffer layer 21 is formed of an insulating material, and includes one or more of silicon nitride, silicon oxide, or silicon oxynitride, etc.

According to an embodiment, the semiconductor layer PS is disposed on the buffer layer 21. The semiconductor layer PS forms a channel of the thin film transistor TFT. The semiconductor layer PS includes polycrystalline silicone. Impurity ions, such as p-type impurity ions in the case of a p-type metal oxide semiconductor (PMOS) transistor, are doped at portions in the semiconductor layer PS, such as the source and drain areas that are connected to the source and drain electrodes SE and DE of the thin film transistor TFT. A trivalent dopant such as boron (B) can be used as a p-type impurity ion. In other embodiments, the semiconductor layer PS includes an oxide semiconductor such as monocrystalline silicon, low-temperature polycrystalline silicon, amorphous silicon, indium-tin-zinc oxide (ITZO), or indium-gallium-zinc oxide (IGZO).

According to an embodiment, a gate insulating layer 22 is disposed on the semiconductor layer PS.

According to an embodiment, a first gate conductive layer is disposed on the gate insulating layer 22. The first gate conductive layer includes the gate electrode GE of the thin film transistor TFT and the first electrode CSE1 of the storage capacitor Cst. In addition, the first gate conductive layer includes a scan signal line that transmits a scan signal to the gate electrode GE.

According to an embodiment, a first interlayer insulating layer 23 is disposed on the first gate conductive layer.

According to an embodiment, the gate insulating layer 22 and the first interlayer insulating layer 23 described above include an inorganic material such as silicon oxide, silicon nitride, or silicon oxynitride.

According to an embodiment, a second gate conductive layer is disposed on the first interlayer insulating layer 23. The second gate conductive layer includes the second electrode CSE2 of the storage capacitor Cst. The first electrode CSE1 and the second electrode CSE2 constitute the storage capacitor Cst, which has the first interlayer insulating layer 23 as a dielectric film.

According to an embodiment, the above-described first and second gate conductive layers include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu). The first gate conductive layer and the second gate conductive layer may each be a single film or a multilayer film.

According to an embodiment, a second interlayer insulating layer 24 is disposed on the second gate conductive layer. The second interlayer insulating layer 24 may be formed of an organic film or an inorganic film that contains an organic material.

According to an embodiment, a first source/drain conductive layer is disposed on the second interlayer insulating layer 24. The first source/drain conductive layer includes the source electrode SE, the drain electrode DE, and a power source voltage electrode ELVDDE of the thin film transistor TFT. The source electrode SE and the drain electrode DE of the thin film transistor TFT are electrically connected to the source area and the drain area of the semiconductor layer PS through contact holes formed through the second interlayer insulating layer 24, the first interlayer insulating layer 23, and the gate insulating layer 22.

According to an embodiment, a first via layer 25 is disposed on the first source/drain conductive layer.

According to an embodiment, a second source/drain conductive layer is disposed on the first via layer 25. The second source/drain conductive layer includes a data signal line DL, a connection electrode CE, and a power source voltage line ELVDDL.

According to an embodiment, the data signal line DL is electrically connected to the source electrode SE of the thin film transistor TFT through a contact hole formed through the first via layer 25. The connection electrode CE is electrically connected to the drain electrode DE of the thin film transistor TFT through another contact hole formed through the first via layer 25. The power source voltage line ELVDDL is electrically connected to the power source voltage electrode ELVDDE through still another contact hole formed through the first via layer 25.

According to an embodiment, the above-described first and second source/drain conductive layers include at least one metal selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), or molybdenum (Mo). The first source/drain conductive layer and the second source/drain conductive layer may each be a single film or a multilayer film.

According to an embodiment, a second via layer 26 is disposed on the second source/drain conductive layer. The first via layer 25 and the second via layer 26 described above are each organic films that include an organic insulating material.

According to an embodiment, the anode electrode ANO is disposed on the second via layer 26. The anode electrode ANO is connected to the connection electrode CE through a contact hole formed through the second via layer 26, and is electrically connected to the drain electrode DE of the thin film transistor TFT through the connection electrode CE.

According to an embodiment, a pixel defining layer 27 is disposed on the anode electrode ANO. The pixel defining layer 27 includes an opening that exposes the anode electrode ANO. The pixel defining layer 27 may be formed of an organic insulating material or an inorganic insulating material.

According to an embodiment, the organic layer EL is disposed in the opening of the pixel defining layer 27. The organic layer EL includes an organic light emitting layer EL1, a hole implantation/transport layer EL2, and an electron implantation/transport layer EL3. Although FIG. 3 illustrates a case in which the hole implantation/transport layer EL2 and the electron implantation/transport layer EL3 are formed as one layer, a plurality of implantation layers and transport layers can be stacked. In addition, at least one of the hole implantation/transport layer EL2 or the electron implantation/transport layer EL3 can be a common layer disposed throughout a plurality of pixels.

According to an embodiment, the cathode electrode CAT is disposed on the organic layer EL and the pixel defining layer 27. The cathode electrode CAT is a common electrode disposed throughout the plurality of pixels.

According to an embodiment, a passivation layer 28 is disposed on the cathode electrode CAT. The passivation layer 28 includes an inorganic material. The passivation layer 28 may include a plurality of stacked films. For example, the passivation layer 28 can include a first inorganic material layer 28a, an organic material layer 28b, and a second inorganic material layer 28c, which are sequentially stacked.

According to an embodiment, the adhesive layer 210 is disposed on the passivation layer 28, and the polarizing film 200 is disposed on the adhesive layer 210.

Figure 4:
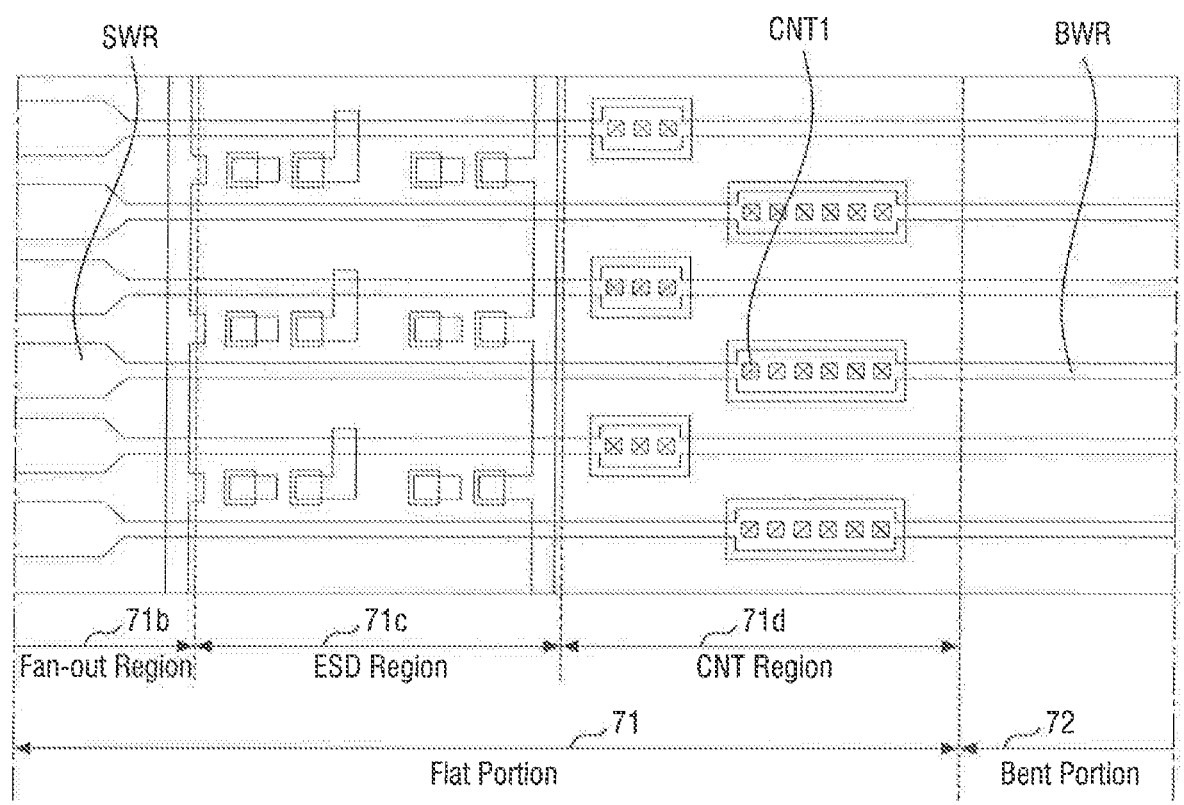
FIG. 4 is a partial layout view of an OLED display device according to an exemplary embodiment.
Figure 5:
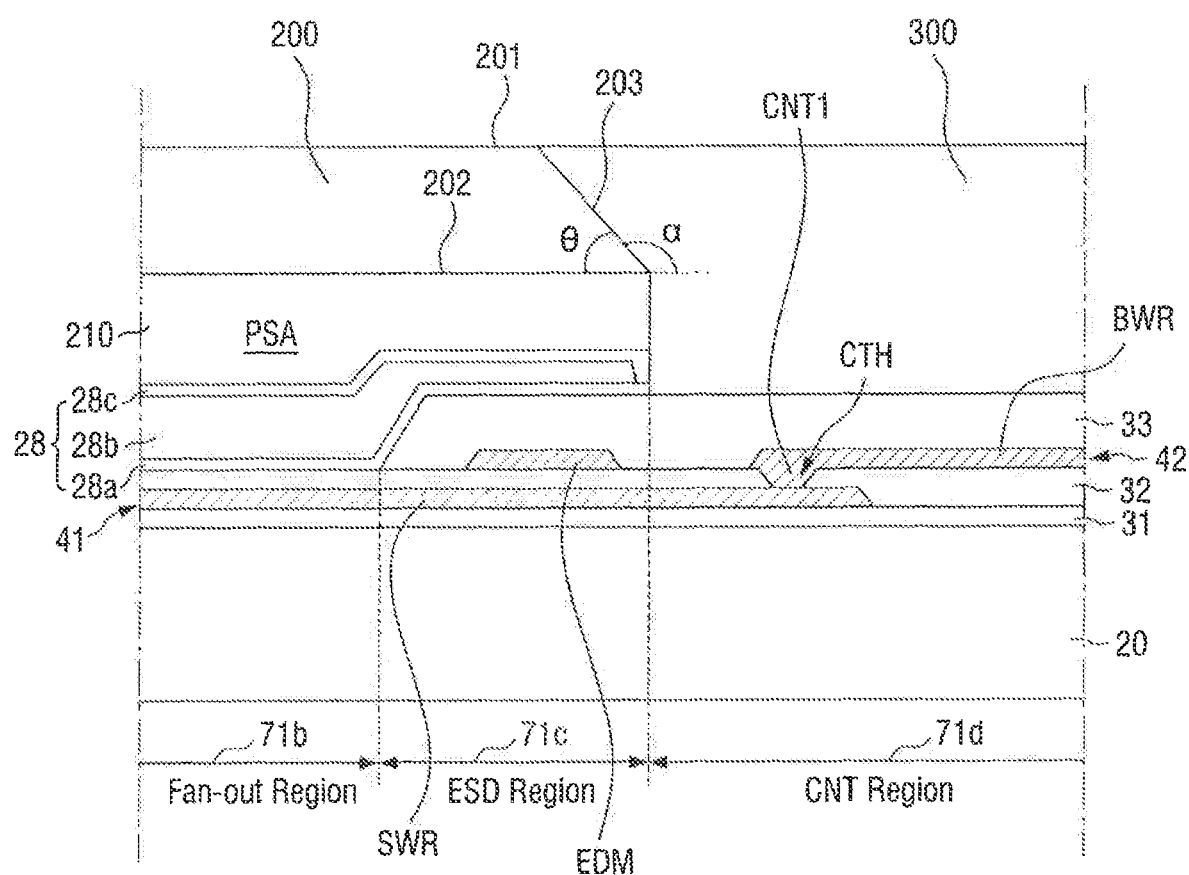
FIG. 5 is a schematic sectional view of an OLED display device of FIG. 4 according to an exemplary embodiment.

FIG. 4 is a partial layout view of an OLED display device according to an exemplary embodiment. FIG. 4 illustrates a partial layout of the non-display area adjacent to the lower edge of the display area of FIG. 1. FIG. 5 is a schematic sectional view of an OLED display device of FIG. 4. In a sectional view of FIG. 5, the insulating layer and the conductive layer are simplified for convenience.

According to an embodiment, referring to FIGS. 4 and 5, a first insulating layer 31, a first conductive layer 41, a second insulating layer 32, a second conductive layer 42, and a third insulating layer 33 are sequentially disposed on the substrate 20. The first conductive layer 41 and the second conductive layer 42 are electrically connected to each other through the contact CNT1 in the wire contact region 71d.

According to an embodiment, the first conductive layer 41 and the second conductive layer 42 are disposed on different layers, and the second conductive layer 42 is disposed above the first conductive layer 41. For example, the first conductive layer 41 may be formed as the first gate conductive layer or the second gate conductive layer described with respect to FIG. 3, and the second conductive layer 42 may be formed as the first source/drain conductive layer or the second source/drain conductive layer described with respect to FIG. 3. For example, when the first conductive layer 41 is formed as the first gate conductive layer and the second conductive layer 42 is formed as the first source/drain conductive layer, the first insulating layer 31 includes the buffer layer 21, the gate insulating layer 22, and the first interlayer insulating layer 23 shown in FIG. 3, the second insulating layer 32 includes the second interlayer insulating layer 24 shown in FIG. 3, and the third insulating layer 33 includes the first via layer 25, the second via layer 26, and the pixel defining layer 27 shown in FIG. 3.

According to an embodiment, the first insulating layer 31 is disposed on the substrate 20 and throughout the fan-out region 71b, the electrostatic dissipation region 71c, and the wire contact region 71d.

According to an embodiment, the first conductive layer 41 includes a signal wire SWR. The signal wire SWR extends from the display area DA through the fan-out region 71b to the wire contact region 71d via the electrostatic dissipation region 71c. The signal wire SWR is electrically connected through a contact CNT1 shown in FIG. 5 of the wire contact region 71d to a bent wire BWR disposed in other layers. The contact CNT1 electrically connects wires of different layers.

According to an embodiment, the second insulating layer 32 covers the first conductive layer 41.

According to an embodiment, the second conductive layer 42 is disposed on the first insulating layer 31. The second conductive layer 42 includes the bent wire BWR. The bent wire BWR partially overlaps the first conductive layer 41 in the wire contact region 71d to be electrically connected to the first conductive layer 41 through a contact hole CTH formed through the second insulating layer 32. The bent wire BWR extends outward from the bending portion 72 and is electrically connected to a driving wire in other layers through a contact disposed on an outer side of the bent portion 72. The printed circuit board 50 on which the driving chip 51 is mounted is electrically connected to a pad of the driving wire through, e.g., an anisotropic conductive film. The driving wire is constituted by, e.g., the first or second gate conductive layer. In addition, a portion EDM of the second conductive layer 42 is disposed in the electrostatic dissipation region 71c to constitute the electrostatic dissipation ESD circuit together with the first conductive layer 41.

According to an embodiment, the third insulating layer 33 is disposed to cover the second conductive layer 42. Although FIG. 5 illustrates a case in which the third insulating layer 33 is disposed in the electrostatic dissipation region 71c and the wire contact region 71d and not disposed in the fan-out region 71b, embodiments are not limited thereto, and the third insulating layer 33 may be disposed in the fan-out region 71b.

According to an embodiment, the passivation layer 28 is disposed on the third insulating layer 33. The passivation layer 28 includes the first inorganic material layer 28a, the organic material layer 28b, and the second inorganic material layer 28c. A side surface of the organic material layer 28b is covered with the second inorganic material layer 28c.

According to an embodiment, the passivation layer 28 covers the display area DA and extends into the non-display area NDA adjacent to the lower edge of the display area DA to cover the fan-out region 71b and the electrostatic dissipation region 71c. A lower edge of the passivation layer 28 is disposed between the electrostatic dissipation region 71c and the wire contact region 71d when viewed from above. Although FIG. 5 illustrates a case in which the side surface of the lower edge of the passivation layer 28 is disposed at the boundary between the electrostatic dissipation region 71c and the wire contact region 71d, embodiments are not limited thereto, and the side surface of the lower edge of the passivation layer 28 may be disposed on the electrostatic dissipation region 71c or the wire contact region 71d.

According to an embodiment, the adhesive layer 210 and the polarizing film 200 are disposed on the passivation layer 28. Lower edges of the polarizing film 200 and the adhesive layer 210 are aligned with the lower edge of the passivation layer 28 when viewed from above.

According to an embodiment, a side surface 203 of the lower edge BEG of the polarizing film 200 has an acute inclination and an asymmetric shape in the thickness direction. Therefore, in an above-described position, an upper surface 201 of the polarizing film 200 is positioned inward from a lower surface 202 of the polarizing film 200. When the polarizing film 200 having an acutely inclined side surface is aligned with the passivation layer 28 disposed thereunder, a reference surface is the lower surface 202 of the polarizing film 200. In this case, the upper surface 201 of the polarizing film 200 is positioned inward from the side surface of the passivation layer 28. The acutely inclined side surface 203 has an asymmetric shape in the thickness direction.

According to an embodiment, the adhesive layer 210 is in contact with the lower surface 202 of the polarizing film 200. The adhesive layer 210 includes a pressure sensitive adhesive (PSA). A planar shape of the adhesive layer 210 is the same as a planar shape of the lower surface 202 of the polarizing film 200. An internal angle of the side surface of the lower edge of the adhesive layer 210 disposed under the polarizing film 200 is a right angle. Further, side surfaces of the remaining edges of the adhesive layer 210 have a perpendicular inclination regardless of whether an upper edge of the polarizing film 200 has an asymmetric shape. However, the edge inclination angles of the adhesive layer 210 are not limited to the illustrated example, and the edges of the adhesive layer 210 may have various other shapes or inclination angles.

According to an embodiment, an inclination angle θ of the side surface 203 of the lower edge BEG of the polarizing film 200 is in a range of about 1° to about 89°, or in a range of about 20° to about 70°. The side surface 203 of the lower edge BEG of the polarizing film 200 is flat.

According to an embodiment, the bent protection layer 300 may be disposed on the third insulating layer 33 of the wire contact region 71d at which the passivation layer 28 is not covered, and on the bending portion 72. The bending protection layer 300 covers the bending portion 72 to protect the substrate 20 and the bent wire BWR and serves to relieve a bending stress. The bent protection layer 300 is partially removed from a mounting area of the printed circuit board 50 on the outer side of the bending portion 72 to expose the pad of the driving wire.

According to an embodiment, a side surface of the bent protection layer 300 is in contact with the side surface of the passivation layer 28, the side surface of the adhesive layer 210, and the side surface 203 of the polarizing film 200. The bent protection layer 300 is formed of an organic material and covers a side surface profile defined by the passivation layer 28, the adhesive layer 210, and the polarizing film 200. A side surface of the bent protection layer 300 in contact with the side surface 203 of the polarizing film 200 has an obtuse inclination angle with respect to a bottom surface of the bent protection layer 300. Therefore, an inclination angle of the side surface of the bent protection layer 300 corresponds to the inclination angles of the side surfaces of the passivation layer 28, the adhesive layer 210, and the polarizing film 200. The sum of inclination angles of side surfaces of two members having corresponding inclination angles is 180°. For example, the inclination angle of the side surface of the bent protection layer 300 where the bent protection layer 300 is in contact with the passivation layer 28 and the adhesive layer 210 is 90°. However, a side surface inclination angle α of the bent protection layer 300 where the bent protection layer 300 is in contact with the polarizing film 200 is in a range of about 91° to about 179°, or in a range of about 110° to about 160°.

According to an embodiment, the bent protection layer 300 is disposed on the side surface 203 of the polarizing film 200, but the bent protection layer 300 or a constituent material thereof is not disposed on the upper surface 201 of the polarizing film 200. Although FIG. 5 illustrates a case in which a height of an upper surface of the bent protection layer 300 is equal to a height of the upper surface 201 of the polarizing film 200, so that the bent protection layer 300 completely covers the side surface 203 of the polarizing film 200, embodiments are not limited thereto, and the height of the upper surface of the bent protection layer 300 may be lower than the height of the upper surface 201 of the polarizing film 200 to expose a part of an upper end of the side surface 203 of the polarizing film.

According to an embodiment, as should be apparent from a method of fabricating an OLED display device in the following description, when the one side surface 203 of the polarizing film 200 has an acute inclination, stress transmitted to a lower portion of the OLED display device during attachment of the polarizing film 200 is relieved, which can prevent a lower structure from cracking. In addition, a contact area between the polarizing film 200 and the bent protection layer 300 is increased to increase a bonding strength between the polarizing film 200 and the bent protection layer 300.

Hereinafter, a method of fabricating an OLED display device according to an embodiment will be described.

The method of fabricating an OLED display device according to one exemplary embodiment includes providing an OLED panel, attaching a polarizing film to the OLED panel, and forming a bent protection layer on the OLED panel.

Figure 6:
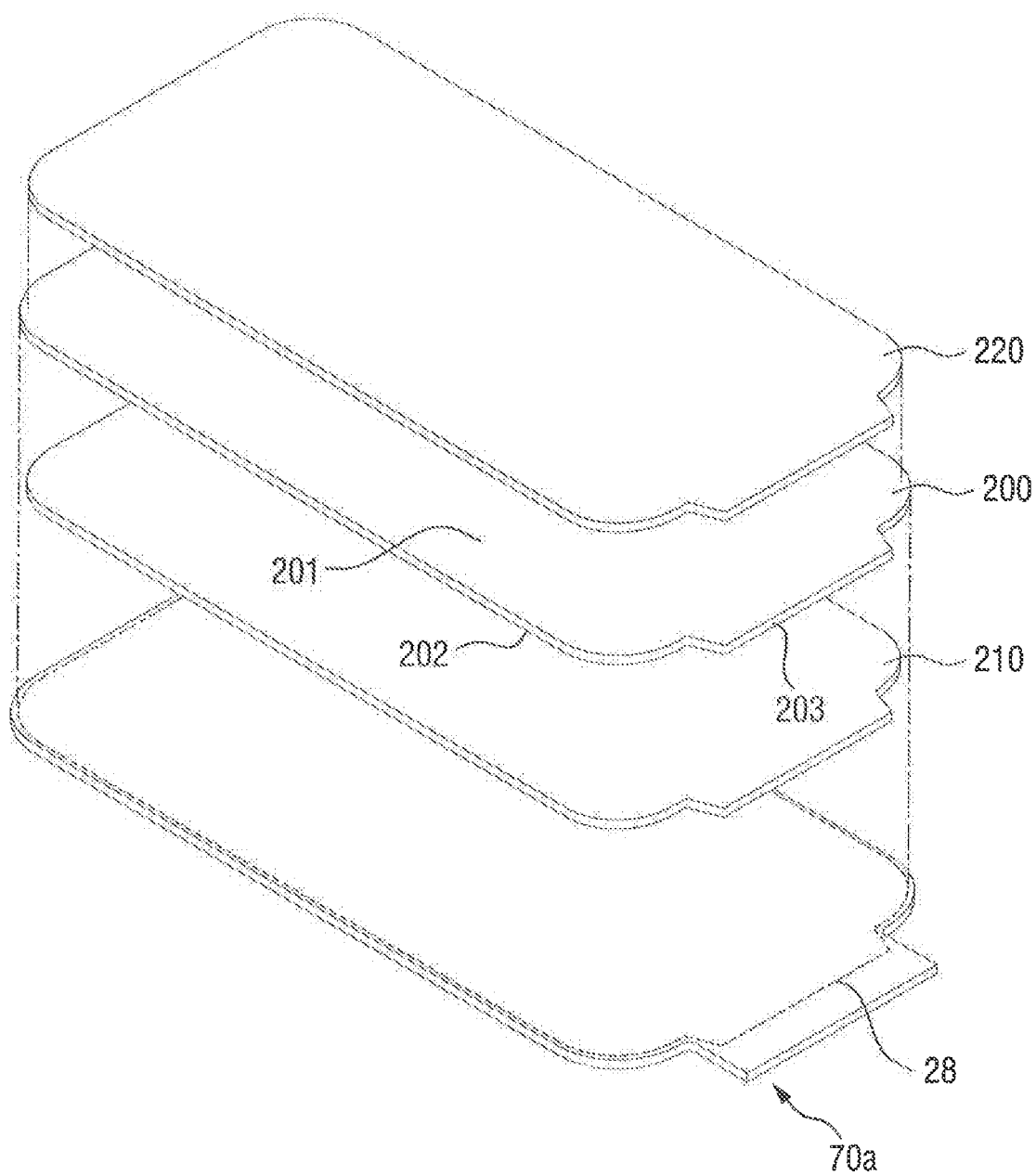
FIGS. 6 and 7 are perspective views that illustrate the attaching of a polarizing film to an OLED panel according to an exemplary embodiment.
Figure 7:
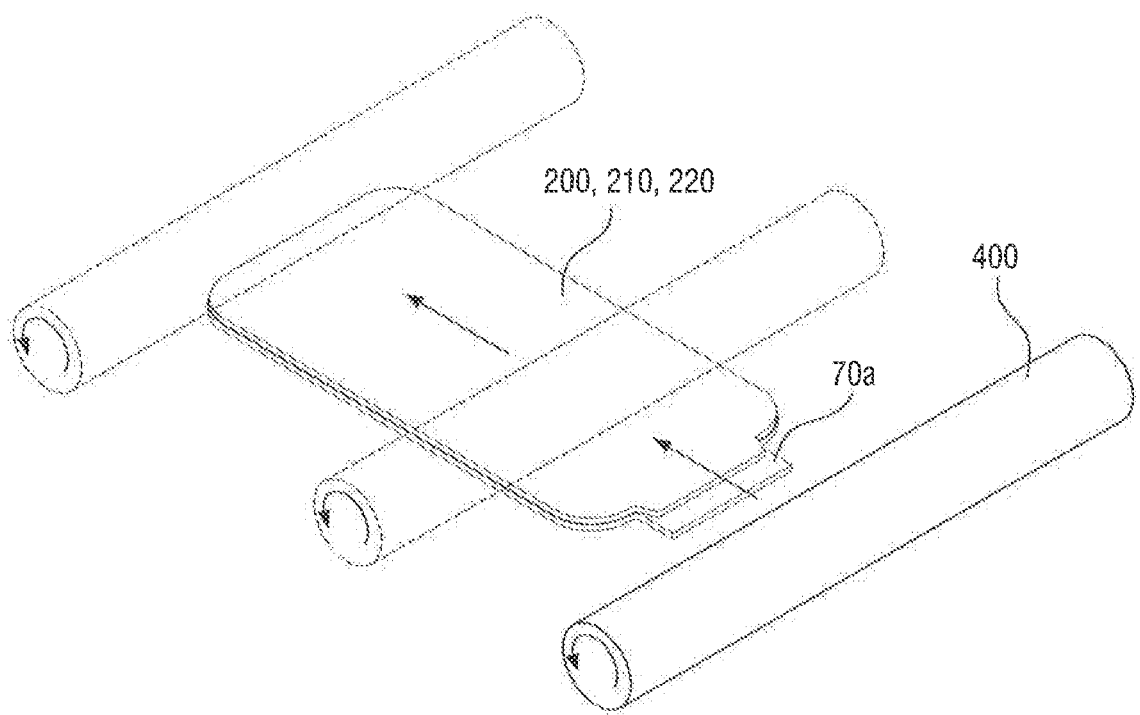

FIGS. 6 and 7 are perspective views that illustrate the attaching of a polarizing film to an OLED panel according to an exemplary embodiment.

According to an embodiment, referring to FIG. 6, an OLED panel 70a is prepared. The OLED panel 70a includes the passivation layer 28. The passivation layer 28 covers an upper edge, a left edge, and a right edge of the OLED panel 70a, and partially exposes a lower portion of the OLED panel 70a.

Subsequently, according to an embodiment, the polarizing film 200 is prepared, which has the lower surface 202 adhered to the adhesive layer 210 and a release film 220 provided on the upper surface 201. The release film 220 protects the upper surface 201 of the polarizing film 200, and may be omitted in some embodiments.

Subsequently, according to an embodiment, the polarizing film 200 is disposed on the passivation layer 28 such that the adhesive layer 210 on the lower surface 202 of the polarizing film 200 comes into contact with an upper surface of the passivation layer 28. The polarizing film 200 has substantially the same planar shape as the planar shape of the passivation layer 28. The polarizing film 200 may already have a final shape before attachment, or may acquire its final shape through a cutting process using, e.g., a laser after attachment.

Referring to FIG. 7, according to an embodiment, the polarizing film 200 is pressed to be attached to the OLED panel 70a. The polarizing film 200 is pressed via a pressure roller 400. The pressure roller 400 extends in a first direction and presses the polarizing film 200 while the polarizing film 200 is moving in a second direction different from the first direction. The first direction is a lateral direction of the OLED panel 70a, and the second direction is a longitudinal direction of the OLED panel 70a. The pressure roller 400 rotates while the pressure roller 400 moves.

According to an embodiment, when the adhesive layer 210 is formed of a PSA, the polarizing film 200 should be sufficiently pressed by the pressure roller 400 for stable attachment of the polarizing film 200. However, when a pressing force is excessive, circuit elements may be damaged, for example, a pixel circuit, a driving circuit, or wires of the OLED panel 70a may crack. The pressing force of the pressure roller 400 is determined so that the pixel circuits of the display area DA are not damaged.

According to an embodiment, the pressing force transmitted by the pressure roller 400 differs depending on position. For example, a pressure stress is dispersed in a forward and a rearward direction with respect to a running direction of the pressure roller 400 when the pressure roller 400 passes a central portion of the polarizing film 200. However, a portion, such as one side edge, at which the pressure roller 400 first comes into contact with the polarizing film 200 is subjected to a larger pressure stress because the polarizing film 200 is disposed only on a front side thereof with respect to the running direction. Moreover, the pressure stress is also related to a contact area. When the contact area shrinks, the transmitted pressure stress increases. For this reason, even when the pressing force has been determined so that the pixel circuits of the display area DA are not damaged, a lower circuit can be damaged due to the increased pressure stress at the edge or end of the polarizing film 200. A detailed description thereof will be given with reference to FIGS. 8A and 8B.

Figure 8A:
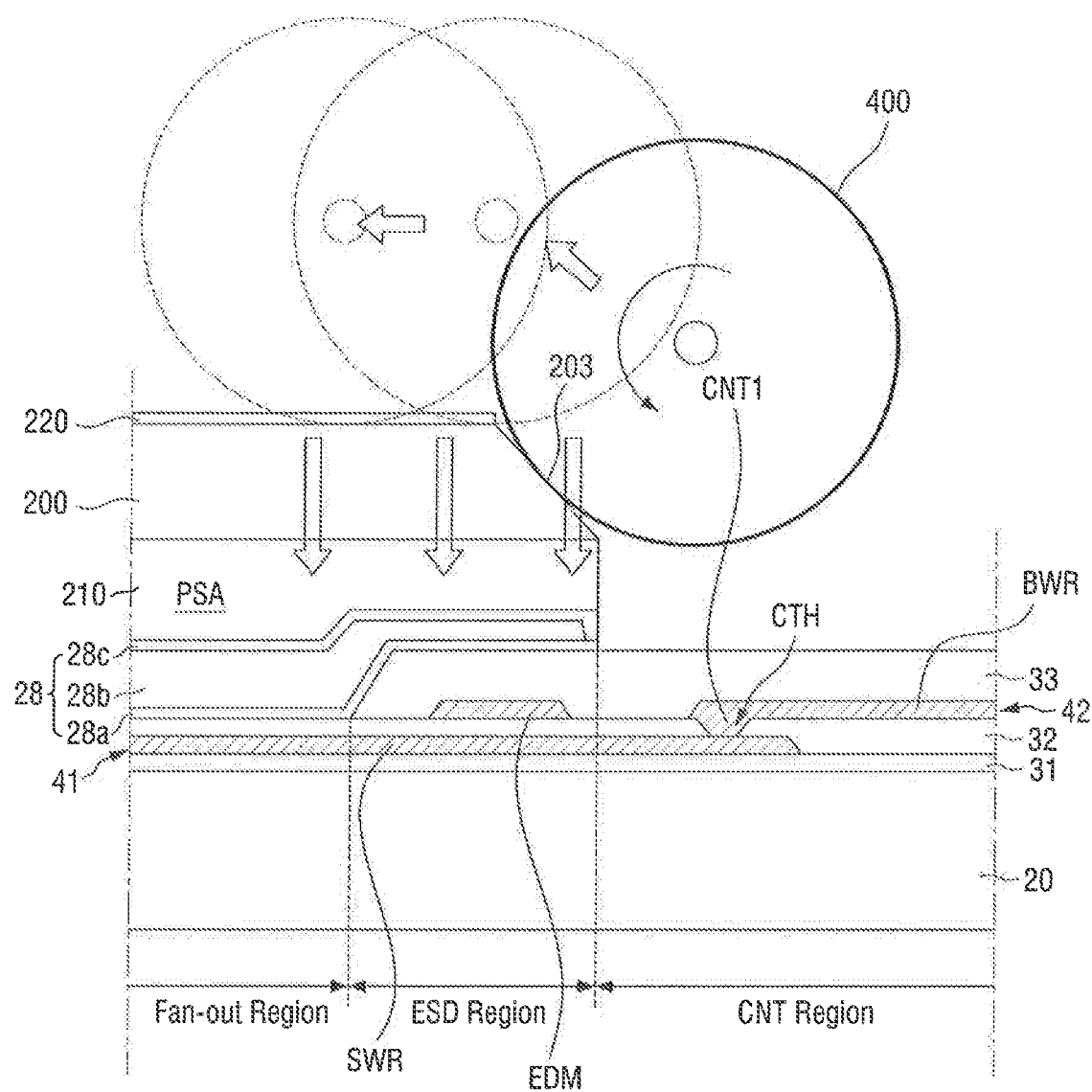
FIGS. 8A and 8B are sectional views that illustrate the attaching of a polarizing film to an OLED panel according to some exemplary embodiments.
Figure 8B:
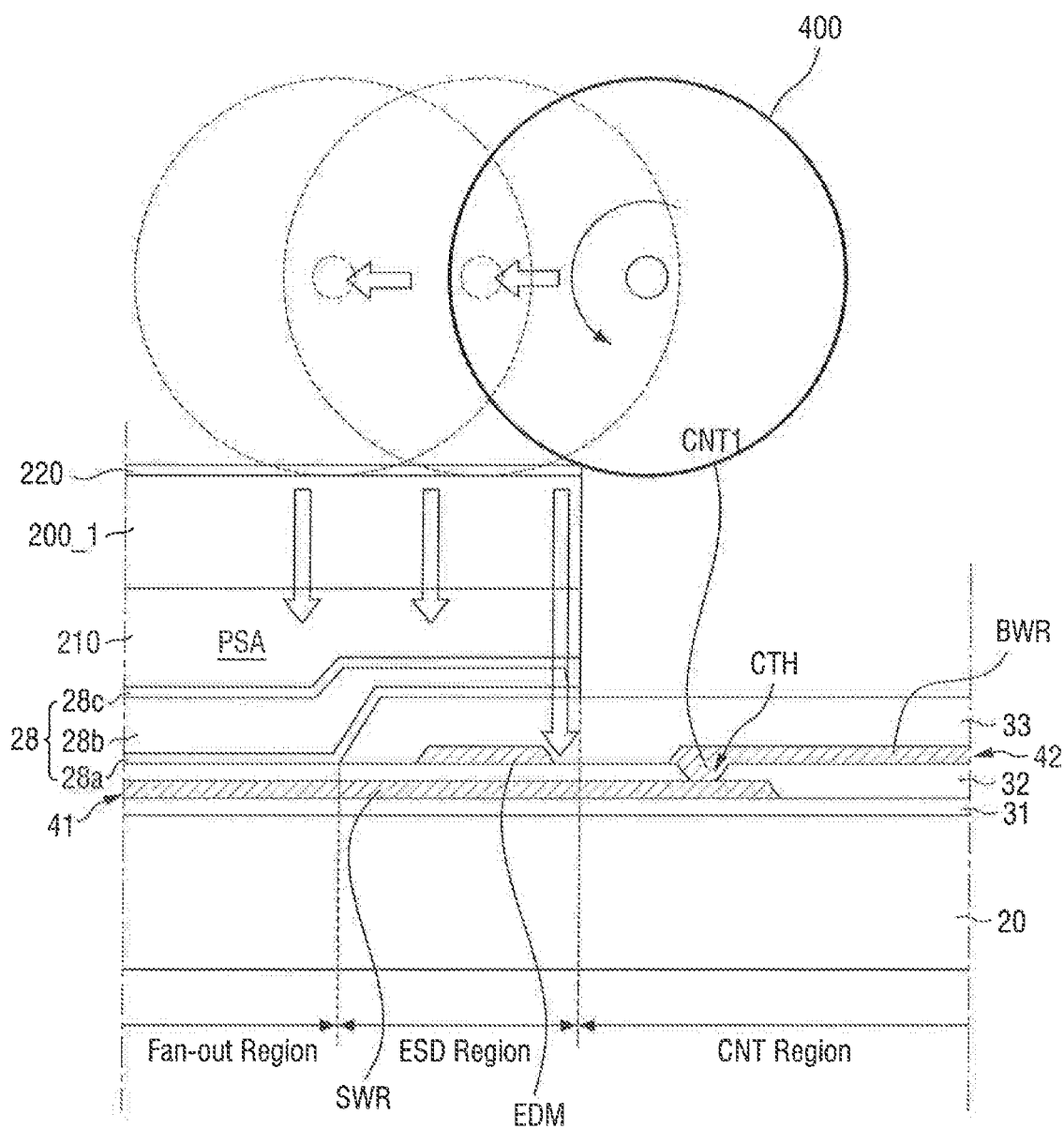

FIGS. 8A and 8B are sectional views that illustrate the attaching of a polarizing film to an OLED panel according to some exemplary embodiments. FIG. 8A illustrates a case in which the side surface 203 of a lower edge of the polarizing film 200 has an acute inclination angle, and FIG. 8B illustrates a case in which a side surface of a lower edge of a polarizing film 200_1 has a right inclination angle.

According to an embodiment, referring to FIG. 8B, in a case in which the side surface of the lower edge of the polarizing film 200_1 has a right inclination angle and a symmetrical shape in a thickness direction thereof, when the pressure roller 400 moves from the lower edge to the upper edge of the OLED panel 70a, the pressure roller 400 initially comes into contact with an upper end of the side surface of the lower edge of the polarizing film 200_1. In this case, the upper end of the polarizing film 200_1 can be damaged and an initial contact area between the polarizing film 200_1 and the pressure roller 400 is small, and thus a pressure stress is concentrated onto the initial contact area. When the pressure stress is concentrated, a magnitude of the stress transmitted to the lower portion increases so that an electrostatic diode circuit element disposed at the lower portion can crack.

On the other hand, according to an embodiment, as shown in FIG. 8A, in a case in which the side surface 203 of the lower edge of the polarizing film 200 has an acute inclination angle and an asymmetric shape in the thickness direction, the pressure roller 400 initially comes into contact with the entire side surface 203 of the lower edge of the polarizing film 200. Therefore, the possibility of damage to the side surface 203 of the polarizing film 200 is reduced in comparison to the case shown in FIG. 8B. In addition, since the initial contact area between the polarizing film 200 and the pressure roller 400 is relatively large, the pressure stress is dispersed so that the stress transmitted to the electrostatic diode circuit element disposed at the lower portion is reduced in comparison to the case of FIG. 8B, which can prevent the circuit element from cracking.

Figure 9:
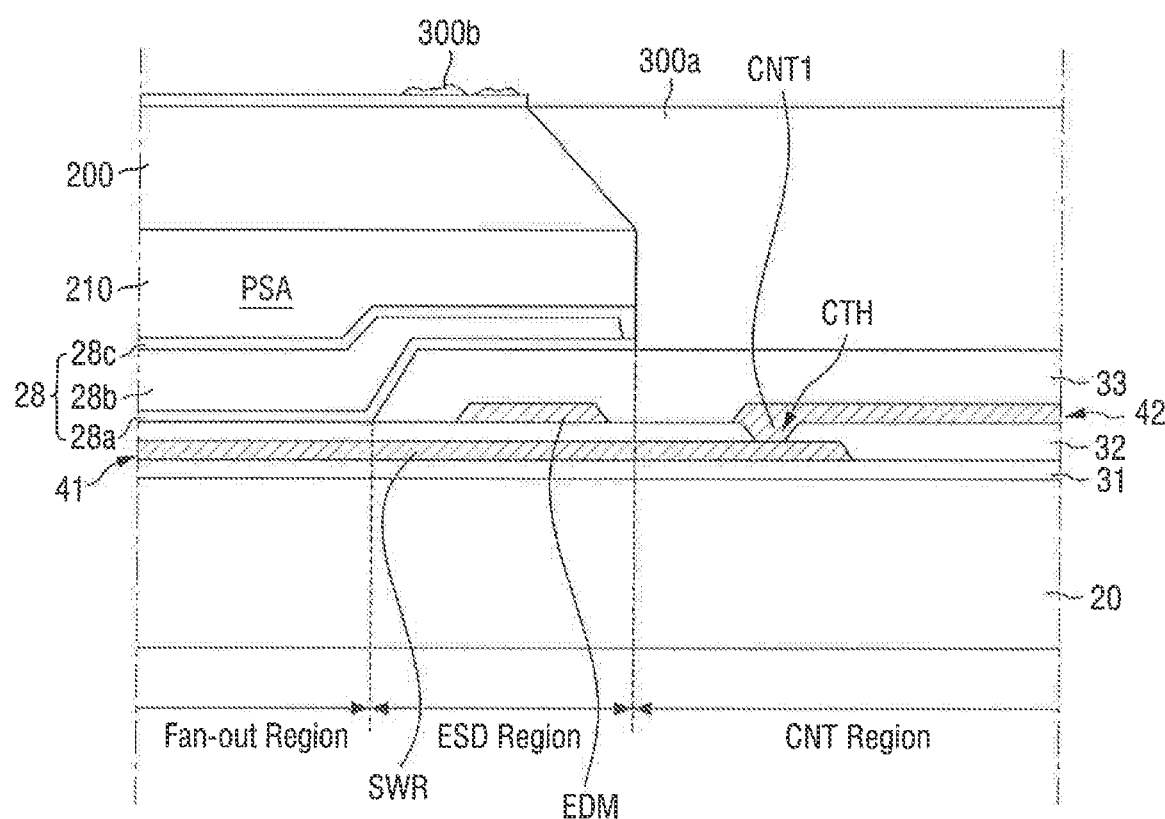
FIGS. 9 and 10 are sectional views that illustrate the forming of a bent protection layer on the OLED panel according to an exemplary embodiment.
Figure 10:
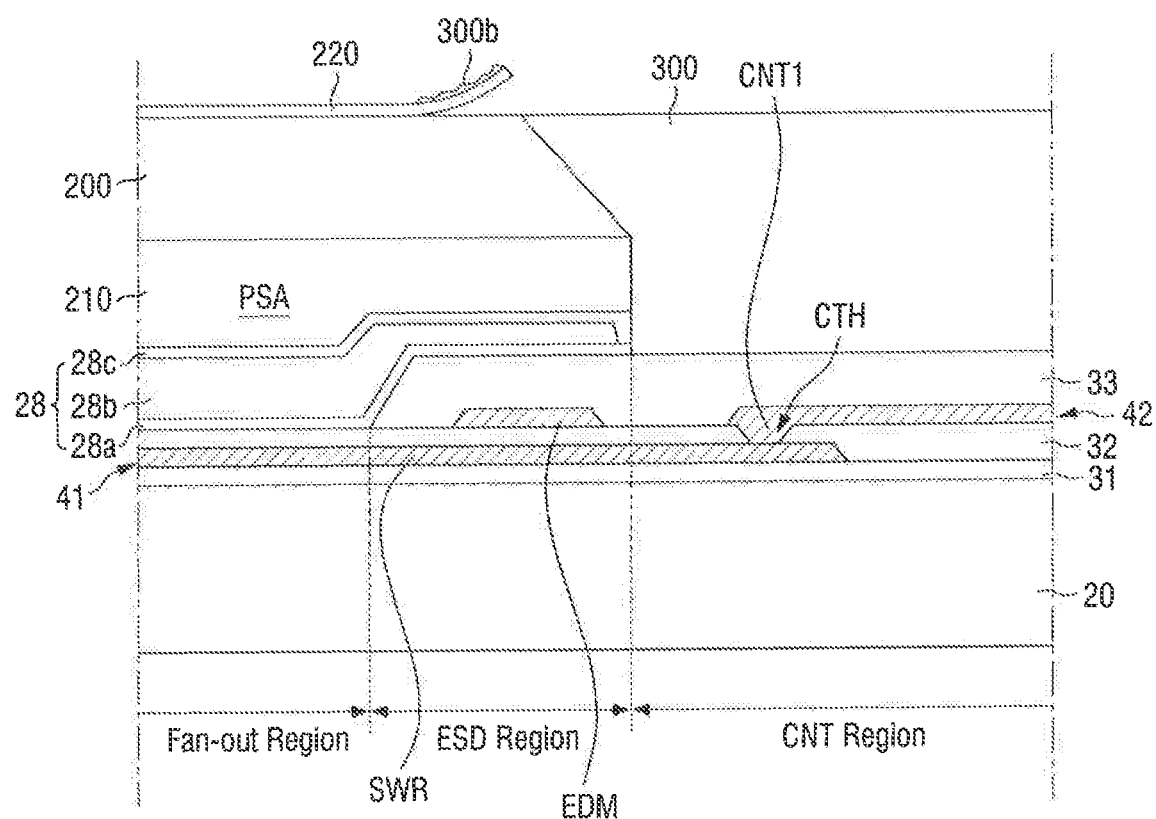

FIGS. 9 and 10 are sectional views that illustrate the forming of the bent protection layer on the OLED panel according to an exemplary embodiment.

Referring to FIG. 9, according to an embodiment, after attaching the polarizing film 200 to the adhesive layer 210, an organic material layer 300a is formed in the wire contact CNT region 71d and the bent portion 72 where the passivation layer 28 is not covered. The organic material layer 300a may be formed by, e.g., slit coating or spin coating, etc. The organic material layer 300a is formed to be in contact with the side surface of the passivation layer 28, the side surface of the adhesive layer 210, and the side surface of the polarizing film 200. Some organic material 300b can be disposed on the release film 220 on the polarizing film 200 during the process of forming the organic material layer 300a to come into contact with the side surface of the polarizing film 200.

Referring to FIG. 10, according to an embodiment, the release film 220 on the polarizing film 200 is peeled and removed. Since the organic material 300b on the release film 220 is also removed in this process, the finished bent protection layer 300 and a constituent material thereof are not disposed on the upper surface 201 of the polarizing film 200.

Hereinafter, a polarizing film according to various embodiments will be described.

FIG. 11 is a plan view of a polarizing film according to an exemplary embodiment. In FIG. 11, a planar shape of the polarizing film is illustrated as a rectangle for convenience of description. FIGS. 12A to 12F are sectional views for illustrating a side surface of each side of a polarizing film according to various embodiments. In FIGS. 12A to 12F, views of left sides in the drawings are sectional views taken in a longitudinal direction, and views of right sides in the drawings are sectional views taken in a lateral direction.

As described above, according to an embodiment, at one or more of four edges of each of polarizing films 200_2 to 200_7, a side surface of each of the polarizing films 200_2 to 200_7 has an acute inclination angle and an asymmetrical shape in a thickness direction thereof, as shown in FIG. 5. There are many such combinations of edges having side surfaces with acute inclination angles. A side surface having no acute inclination angle has a symmetrical shape in the thickness direction, and may have, for example, a right inclination angle.

Figure 12A:
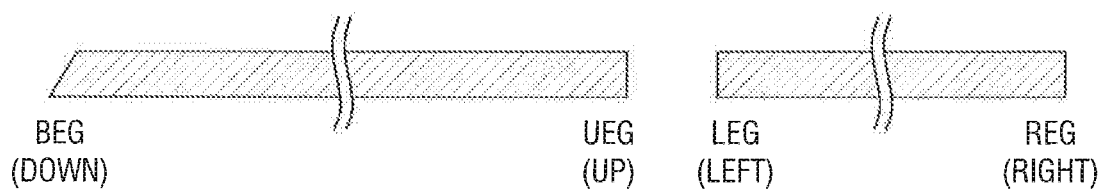
FIGS. 12A to 12F are sectional views of a side surface of each side of a polarizing film according to various embodiments.

For example, as shown in FIG. 12A, of the four sides of the lower edge BEG, an upper edge UEG, an left edge LEG, and an right edge REG of the polarizing film 200_2, only one side surface, a lower edge BEG, has an acute inclination angle, and the remaining three edges may have a right inclination angle. That is, one edge has an asymmetric shape in the thickness direction while three edges have a symmetrical thickness shape.

Figure 12B:
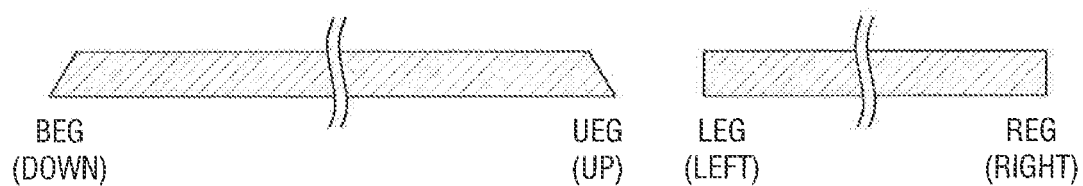
Figure 12C:
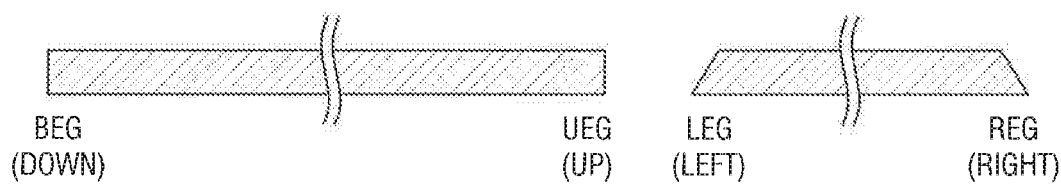
Figure 12D:
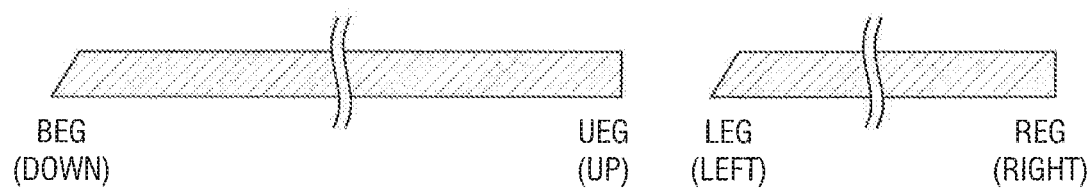

According to another embodiment, as shown in FIGS. 12B, 12C, and 12D, two edges of each of the polarizing films 200_3, 200_4, and 200_5 have an acute inclined surface, and the remaining two edges may have a right inclined surface. That is, the two edges have an asymmetrical thickness shape while the remaining two edges may have a symmetrical thickness shape.

In more detail, according to embodiments, the side surface has an acute inclination angle at an upper edge UEG and a lower edge BEG of the polarizing film 200_3, as shown in FIG. 12B, or an acute inclination angle at a left edge LEG and a right edge REG of the polarizing film 200_4, as shown in FIG. 12C. The embodiment shown in FIG. 12B is useful when the pressure roller 400 is moved in the longitudinal direction, and the embodiment shown in FIG. 12C is useful when the pressure roller 400 is moved in the lateral direction. In addition, as shown in FIG. 12D, the side surface has an acute inclination angle at one of the upper and lower edges UEG and BEG of the polarizing film 200_5 and one of the left and right edges LEG and REG of the polarizing film 200_5.

Figure 12E:
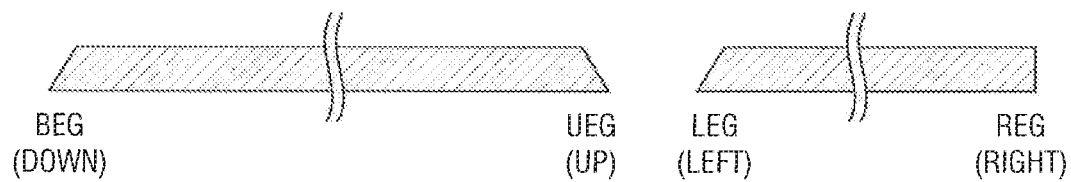

According to another embodiment, as shown in FIG. 12E, the side surface may have an acute inclination angle at three edges, e.g., a lower edge BEG, an upper edge UEG, and a left edge LEG, of the polarizing film 200_6, and the remaining edge has a right inclined side surface. That is, three edges have an asymmetric thickness shape while one edge has a symmetrical thickness shape.

Figure 12F:
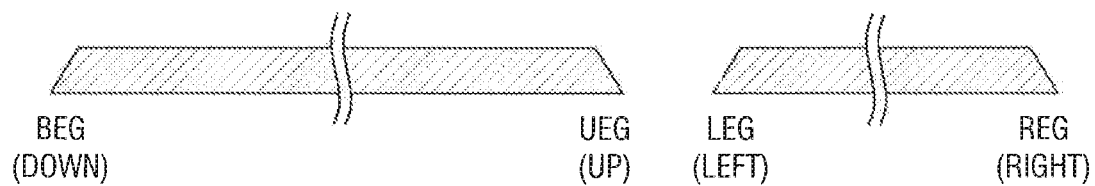

According to another embodiment, as shown in FIG. 12F, all four edges of the polarizing film 200_7 have acutely inclined side surface. That is, all of the edges have an asymmetric thickness shape.

According to embodiments, when two or more edges of the polarizing films 200_2 to 200_7 have acutely inclined side surfaces, the acute inclination angles may be identical for each side surface or values of the acute inclination angles may differ.

Figure 13:
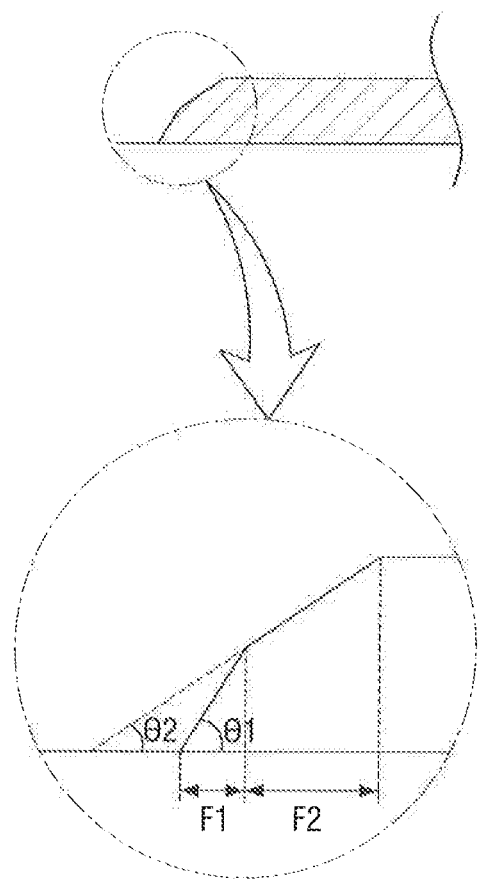
FIG. 13 is a sectional view of a polarizing film according to an exemplary embodiment.

FIG. 13 is a sectional view of a polarizing film according to another exemplary embodiment.

Referring to FIG. 13, a side surface of a polarizing film 200_8 according to a present exemplary embodiment includes at least two planes having different inclination angles. As shown in the sectional view, a side surface profile includes at least two straight lines having different slopes.

According to embodiments, the acutely inclined side surface includes a first section F1 having a first inclination angle θ1 and a second section F2 having a second inclination angle θ2. As shown in the sectional view, the second section F2 is disposed above the first section F1.

According to embodiments, the second inclination angle θ2 of the second section F2 disposed above the first section F1 is less than the first inclination angle θ1 of the first section F1 disposed below the second section F2. The second inclination angle θ2 is in a range of about 1° to about 89°, or in a range of about 20° to about 70°. The first inclination angle θ1 may be an acute angle or a right angle.

In addition, the side surface of the polarizing film 200_8 may further include a third section disposed above the second section F2. A third inclination angle of the third section is less than the second inclination angle θ2 of the second section F2.

As described above, according to an embodiment, as the inclination angle of the side surface gradually decreases toward an upper portion, based on a thickness direction of the polarizing film 200_8, a pressure stress of the pressure roller 400 can be properly dispersed at an edge of the polarizing film 200_8. Therefore, damage to a circuit element under the edge of the polarizing film 200_8 can be prevented.

Figure 14:
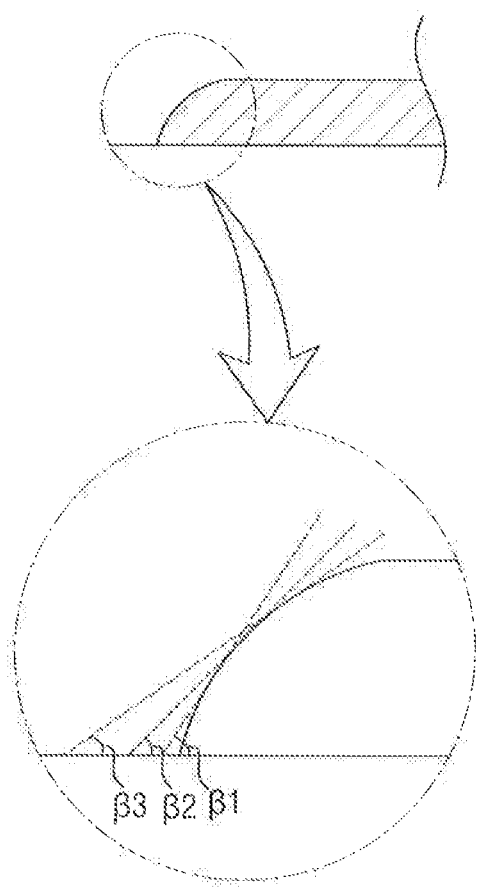
FIG. 14 is a sectional view of a polarizing film according to another exemplary embodiment.

FIG. 14 is a sectional view of a polarizing film according another exemplary embodiment.

Referring to FIG. 14, according to embodiments, a side surface of a polarizing film 200_9 differs from that of the embodiment shown in FIG. 5 because the side surface is rounded.

In more detail, according to embodiments, the side surface of the polarizing film 200_9 has an outwardly convex curved shape. Inclination angles $\beta 1$, $\beta 2$, and $\beta 3$ of each section of the side surface are defined as an inclination angle of a tangent plane to the corresponding curved surface. The inclination angles gradually decrease toward an upper portion of the polarizing film 200_0.9, so that $\beta 1 > \beta 2 > \beta 3$.

In a present exemplary embodiment, since the inclination angles $\beta 1$, $\beta 2$, and $\beta 3$ of the side surfaces gradually decrease toward the upper portion of the polarizing film 200_9, pressure stress of the pressure roller 400 can be properly dispersed at an edge of the polarizing film 200_9. Therefore, damage to a circuit element under the edge of the polarizing film 200_9 can be prevented.

As is apparent from the above description, according to some exemplary embodiments, at least one side surface of an optical film has an acute inclination angle to relieve stress transmitted to a lower portion of a display panel, which can prevent a lower structure from cracking. A contact area between the optical film and a bent protection layer is increased to increase bonding strength therebetween.

The effects according to some exemplary embodiments are not limited by the content exemplified above, and other various effects are included in the specification.

What is claimed is:

1. A display device comprising:
   a display panel;
   an optical film attached to the display panel; and
   an adhesive layer disposed between the optical film and the display panel and that attaches the optical film to the display panel,
   wherein the optical film extends in a first direction and a second direction that crosses the first direction and comprises a plurality of edges,
   a side surface of at least one edge of the plurality of edges of the optical film is an acutely inclined surface that has an acute inclination angle with respect to a lower surface of the optical film and an asymmetric shape in a thickness direction of the optical film, and
   wherein the adhesive layer extends in the first direction and the second direction and side surfaces of all edges of the adhesive layer have a right inclination angle with respect to a bottom surface of the adhesive layer.

2. The display device of claim 1, wherein: the at least one edge is positioned inward from a side edge of the display panel.

3. The display device of claim 2, wherein:
   the display panel comprises a passivation layer; and
   the at least one edge is aligned with one side edge of the passivation layer.

4. The display device of claim 1, wherein:
   the display panel comprises a flat portion and a bent portion disposed a to side of the flat portion; and
   the at least one edge of the optical film is disposed on the flat portion.

5. The display device of claim 4, further comprising a bent protection layer that covers the bent portion and in contact with the acutely inclined surface.

6. The display device of claim 5, wherein a side surface of the bent protection layer in contact with the acutely inclined surface has an obtuse inclination angle with respect to a bottom surface of the bent protection layer.

7. The display device of claim 1, wherein:
   the display panel comprises an electrostatic dissipation region in which an electrostatic diode is disposed; and
   the at least One edge of the optical film is disposed on the electrostatic dissipation region.

8. The display device of claim 1, wherein the acutely inclined surface of the optical film is flat.

9. The display device of claim 1, wherein the acutely inclined surface of the optical film comprises:
   a first section having a first inclination angle; and
   a second section disposed above the first section and having a second inclination angle less than the first inclination angle.

10. The display device of claim 1, wherein the acutely inclined surface of the optical film has an outwardly curved convex shape.

11. The display device of claim 1, wherein:
    the display panel comprises an organic light emitting display panel; and
    the optical film comprises a polarizing film.

12. A method of fabricating a display device, the method comprising:
    providing a display panel;
    disposing an optical film on the display panel, wherein the optical film extends in a first direction and a second direction that crosses the first direction,
    wherein a lower surface of the optical film is adhered to an adhesive layer, wherein the adhesive layer extends in the first direction and the second direction, wherein a side surface of one side edge of the optical film has an acute inclination angle with respect to a bottom surface of the optical film and an asymmetrical shape in a thickness direction of the optical film, and wherein side surfaces of all edges of the adhesive layer have a right inclination angle with respect to a bottom surface of the adhesive layer; and
    pressing the optical film in a direction from the one side edge to an opposite side edge.

13. The method of claim 12, wherein pressing the optical film comprises moving a pressure roller.

14. The method of claim 12, wherein
    the display panel comprises a flat portion and a hem portion, and
    the optical film is disposed on the flat portion,
    wherein the method further comprises
      forming a bent protection layer that covers the bent portion of the display panel, wherein the bent protection layer is in contact with the side surface of one side edge of the optical film.

15. The method of claim 14, wherein the optical film comprises a polarizing film and a release film disposed on an upper surface of the polarizing film, and
    the method further comprises removing the release film after forming the bent protection layer.

16. A polarizing film, comprising:
    a plurality of edges,
    wherein side surfaces of at least two edges of the plurality of edges are acutely inclined surfaces,
    wherein each of the acutely inclined surfaces has an acute inclination angle with respect to a bottom surface of the polarizing film and an asymmetric shape in a thickness direction of the polarizing film.

17. The polarizing film of claim 16, wherein each of the acutely inclined surfaces is flat.

18. The polarizing film of claim 16, wherein at least one of the acutely inclined surfaces comprises:
   a first section having a first inclination angle; and
   a second section disposed above the first section and having a second inclination angle that is less than the first inclination angle.

19. The polarizing film of claim 16, wherein at least one of the acutely inclined suffices has an outwardly curved convex shape.

* * * * *